(12) United States Patent
Posseme et al.

(10) Patent No.: US 11,393,689 B2
(45) Date of Patent: Jul. 19, 2022

(54) METHOD FOR FORMING SPACERS OF A TRANSISTOR

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Saint Martin d'Heres (FR)

(72) Inventors: Nicolas Posseme, Grenoble (FR); Marceline Bonvalot, Eybens (FR); Ahmad Chaker, Grenoble (FR); Christophe Vallee, Le Touvet (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE (CNRS), Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 40 days.

(21) Appl. No.: 16/926,148

(22) Filed: Jul. 10, 2020

(65) Prior Publication Data
US 2021/0013040 A1     Jan. 14, 2021

(30) Foreign Application Priority Data
Jul. 11, 2019  (FR) ...................................... 19 07836

(51) Int. Cl.
*H01L 21/28*    (2006.01)
*H01L 21/311*   (2006.01)
(Continued)

(52) U.S. Cl.
CPC .... *H01L 21/28123* (2013.01); *H01L 21/0217* (2013.01); *H01L 21/0228* (2013.01);
(Continued)

(58) Field of Classification Search
None
See application file for complete search history.

(56) References Cited

U.S. PATENT DOCUMENTS

| 2015/0162190 A1 | 6/2015 | Posseme |
| 2015/0249017 A1* | 9/2015 | Raley ............... H01L 21/31116 438/696 |
| 2017/0154826 A1 | 6/2017 | Posseme et al. |

FOREIGN PATENT DOCUMENTS

| EP | 2 876 677 A1 | 5/2015 |
| EP | 3 174 092 A1 | 5/2017 |

OTHER PUBLICATIONS

French Preliminary Search Report dated Mar. 5, 2020 in French Application 19 07836 filed on Jul. 11, 2019 (with English Translation of Categories of Cited Documents & Written Opinion), 10 pages.

\* cited by examiner

*Primary Examiner* — Asok K Sarkar
(74) *Attorney, Agent, or Firm* — Oblon, McClelland, Maier & Neustadt, L.L.P.

(57) ABSTRACT

A method for forming spacers on a gate pattern includes deposition of a first dielectric layer having basal portions on an active layer and side portions of the edges of the pattern; anisotropic modification of only the basal portions of the first layer, so as to obtain modified basal portions; deposition of a second dielectric layer on the first layer, also having basal and side portions; anisotropic etching of only the basal portions of the second layer, so as to remove these basal portions while conserving the side portions; and removal of
(Continued)

the modified basal portions while conserving the first and second non-modified side portions, by selective etching of the modified dielectric material vis-à-vis the non-modified dielectric material.

20 Claims, 7 Drawing Sheets

(51) Int. Cl.
*H01L 21/02* (2006.01)
*H01L 21/3115* (2006.01)
*H01L 29/66* (2006.01)
*H01L 29/06* (2006.01)
*H01L 29/78* (2006.01)

(52) U.S. Cl.
CPC .. *H01L 21/02112* (2013.01); *H01L 21/02126* (2013.01); *H01L 21/02164* (2013.01); *H01L 21/02167* (2013.01); *H01L 21/02274* (2013.01); *H01L 21/31111* (2013.01); *H01L 21/31155* (2013.01); *H01L 29/6653* (2013.01); *H01L 29/6656* (2013.01); *H01L 29/0649* (2013.01); *H01L 29/785* (2013.01); *H01L 29/7838* (2013.01)

US 11,393,689 B2

METHOD FOR FORMING SPACERS OF A TRANSISTOR

TECHNICAL FIELD

The present invention relates to a method for producing spacers of a transistor. It will have an advantageous application in the production of spacers on the edges of a gate of a transistor with an excellent dimensional control and by avoiding the formation of residues or defects on or in the semi-conductive active layer underlying the abovementioned elements. A field of the application relates to the production of FinFET or FDSOI transistors.

STATE OF THE ART

The spacers of a transistor generally cover the side edges of the gate of the transistor. They bear on the active layer of the transistor at the foot of the gate. The spacers make it possible to protect the gate during the formation of source and drain regions of the transistor. They make it possible to electrically insulate the gate vis-à-vis source and drain regions, and are partially intended to limit the interfering capacitive coupling between the gate and these source and drain regions.

A good controlling of the thickness of these spacers, and of the morphology of these spacers at the level of the gate foot is a key factor for improving the performances of the transistors.

The spacers are generally manufactured in two steps:
- a silicon nitride layer is first deposited in a conformal manner on the gate 3 and the active layer 10, and
- this silicon nitride layer is then etched anisotropically to remove the portions of it resting on the active layer 10 while keeping the portions of it covering the side edges 5 of the gate 3 and intended to form spacers 112.

The anisotropic etching generally leads to either of the following situations illustrated in FIGS. 1A and 1B:
- the active layer 10 preserved but the spacers 112 have a foot 111 (under-etching situation illustrated in FIG. 1A),
- the spacers 112 have a vertical profile, but the active layer 10R is damaged (over-etching situation illustrated in FIG. 1B).

With the reduction of dimensions of transistors and the appearance of new transistor architectures, in particular of transistors requiring the formation of spacers above an active layer of low thicknesses, these under-etching and over-etching situations have particularly damaging disadvantages. These disadvantages are particularly damaging in FinFET-type transistors (Fin Field-Effect Transistor), and in FDSOI-type transistors (Fully Depleted Semiconductor on Insulator).

In case of under-etching (FIG. 1A), the spacer foot 111 does not make it possible to form a steep junction between the channel of the transistor and the source and/or drain regions.

In case of over-etching (FIG. 1B), the damaged active layer 10R (by creating crystalline defects, amorphisation, recess formation 113) causes defects in the transistor and degrades the performances of the latter. In particular, the damaging of the active layer 10 can damage the quality of the epitaxy will be carried out from this active layer 10 to form the raised source/drain (RSD) zones. The performances of the transistor will be directly altered from it. Typically, if the thickness of the damaged active layer 10R is less than 4 nm ($10^{-9}$ metres), the epitaxial growth of the RSDs will not be carried out under good conditions. Moreover, the damaging of the active layer 10 can increase the leakage currents which will also damage the functioning of the transistor and will degrade the performances of the latter.

Several solutions have been proposed to reduce the risks of appearance of feet or damaging of the underlying layer.

Certain solutions are based on the improvement of equipment for etching the nitride layer. Some of these solutions are based on the use of plasma etchings during which the temperature of the electrons is reduced to lower the energy of the ions. These solutions however have the disadvantage of reducing the anisotropy of the etching which leads to a degradation of the dimensional control. Moreover, these techniques are not compatible with the polymerising chemistries since the use of low-energy plasmas leads to the deposition of thin films on the treated surfaces. For example, the use of chemistries, typically $CF_4/CH_4$-based, make it possible to improve the selectivity of the etching of the $Si_3N_4$ vis-à-vis Si, but leads to the formation of significant feet.

Another type of solution to limit the appearance of the recess and of the spacer foot is disclosed in documents FR3000601 A1 and FR3023971 A1.

This solution consists of replacing the anisotropic etching step by an implantation step intended to modify the portions of the silicon nitride layer to be removed, followed by a selective etching step making it possible to only remove these modified portions of the silicon nitride layer.

This method for forming spacers is illustrated in FIGS. 2A to 2C:
- a silicon nitride layer 11 is first deposited in a conformal manner on the gate 3 and the active layer 10 (FIG. 2A),
- this silicon nitride (SiN) layer 11 is then modified locally by anisotropic implantation 200 of light ions ($H_7$, He) at the level of the portions 11M of the layer to be removed (FIG. 2B), typically on a thickness greater than 5 nm, and
- these modified portions 11M are then removed by selective etching of modified SiN vis-à-vis non-modified SiN (FIG. 2C).

This solution improves the formation of spacers 112 by avoiding the formation of spacer feet while limiting the appearance of recesses, comparatively to a conventional anisotropic etching based on a fluorocarbon chemistry.

However, it has proven to be in practice, that this solution does not make it possible to totally avoid the appearance of the recess.

The present invention aims to overcome some of the disadvantages mentioned above.

Therefore, there is a need consisting of proposing a solution for reducing, even for removing, at least some of the disadvantages of the solutions mentioned above. In particular, there is a need to form spacers 112 having a very well controlled thickness, without feet, and without impact on the underlying active layer. This need is illustrated in FIG. 3. The critical dimension (CD) depends in particular on the uniformity and of the reproducibility of the spacers. Typically, to produce transistors, the critical dimension can be or can depend on the width of the gate pattern 1 including the spacers 112, this width being measured in a plane parallel to the basal plane. The absence of spacer feet at the base of the gate pattern 1 makes it possible, in particular to significantly improve this CD. The absence of recesses or defects in the active layer 10 is another significant challenge during the formation of the spacers 112.

The present invention in particular aims for a method for forming spacers removing or limiting the appearance of recesses in the active layer, and removing or limiting the formation of feet at the bottom of the edges of a gate pattern of a transistor.

The other aims, features and advantages of the present invention will appear upon examining the following description and supporting drawings. It is understood that other advantages can be incorporated.

SUMMARY

To achieve the aims mentioned above, the present invention provides, according to a first aspect, a method for forming spacers on a transistor gate pattern comprising the following successive steps:
  Providing a stack comprising at least one active layer extending along a basal plane and the gate pattern surmounting the active layer, the gate pattern having side edges extending along planes substantially perpendicular to the active layer,
  Depositing on the gate pattern and the active layer, a first layer made of a first dielectric material having a thickness e1. The first layer comprises first side portions covering the side edges of the gate pattern. The first layer also comprises first basal portions, extending parallel to said basal plane and covering the active layer, the first side portions being substantially normal to the first basal portions,
  Achieving an anisotropic modification of said first layer along a favoured direction parallel to the side edges, so as to obtain first modified basal portions by conserving first non-modified side portions,
  Carrying out at least one sequence comprising the following steps:
    i. Depositing on said first layer, a second layer made of a second dielectric material having a thickness e2 and comprising second side portions covering the first non-modified side portions, said second side portions being directly in contact with the first non-modified side portions, and second basal portions, extending parallel to the basal plane and covering the first modified basal portions, and
    ii. Carrying out an anisotropic etching of said second layer along a favoured direction parallel to the side edges, so as to remove the second basal portions by conserving at least one portion of the second non-modified side portions and by conserving at least one portion of the thickness e1 of the first modified basal portions, and
  Removing the first modified basal portions which are stripped from said anisotropic etching of said second layer by conserving the first and second non-modified side portions to form spacers.

The present invention thus provides a solution making it possible to form spacers on the base of first and second non-modified side portions, having a thickness E=e1+e2 on the side edges of the gate pattern. E is measured from an edge of the gate along a direction parallel to the basal plane.

This thickness E is perfectly controlled and constant along the side edges. Advantageously, the first and second non-modified side portions are conserved to form the spacers. This improves the precision on controlling the thickness E and the CD. The formation of the spacers is done therefore from at least two layers (the first and second layers). Thus, according to this example, the first and second layers form functional spacers.

The anisotropic selective etching and removal steps furthermore make it possible to avoid the formation of spacer feet at the base of the gate pattern.

The precision and the uniformity of the CD are thus improved.

From the deposition of the second layer, a dielectric layer of thickness E comprising the first and second layers is formed.

The basal portions of this dielectric layer (formed by the first and second basal portions) are removed in two successive steps. This makes it possible, advantageously, to preserve the active layer.

The anisotropic etching makes it possible to first remove the second basal portions on a thickness of the order of e2. This anisotropic etching can possibly impact the first underlying basal portions. However, the first basal portions of thickness e1 thus make it possible to protect the underlying active layer of this anisotropic etching, which is one of the causes of the appearance of the recess and/or structural defects in the active layer.

The developments led in the scope of the present invention have indeed made it possible to identify that:
  The damaging of the active layer is linked to an etching or implantation depth which is too great.
  The uncertainty on this depth is all the greater than the dielectric layer to be implanted or to be etched is thick.

Thus, known solutions based on the anisotropic etching of the dielectric layer of thickness E lead to the appearance of a recess.

Known solutions based on a modification of the dielectric layer by implantation of hydrogen or helium ions over the whole of the thickness E thereof also lead to the appearance of a slight recess. In the scope of the development of the present invention, it has been identified that this is mainly due to a significant implantation energy which increases the uncertainty on the implantation depth.

On the contrary, according to the invention, only the thickness e1 is modified by implantation. This thickness e1 is strictly less than the thickness E of the dielectric layer. The implantation energy can thus be reduced with respect to the implantation energy used in current solutions.

The uncertainty on the implantation depth is therefore also reduced.

It is thus possible to implant the first basal portions of thickness e1 without impacting the underlying active layer.

The thickness e1 is preferably low, for example less than or equal to 4 nm, and the implantation energy is preferably limited, for example less than 30 eV, preferably less than 20 eV.

Moreover, a modification by implantation of the first layer before the deposition of the second layer makes it possible to avoid a cumulation of the uncertainties of etching and implantation depths.

The uncertainty on the implantation depth of the first layer of thickness e1 is thus minimised.

The method according to the invention advantageously makes it possible to form spacers without feet, with a very good CD control, and without damaging the underlying active layer. A CD example is referenced in FIG. 4E. In this example, the CD corresponds to the width of the gate pattern including the spacers.

An alternative solution, which differs from the claimed solution, but which would have been able to be considered in the scope of the development of the present invention would have consisted of:

depositing a conformal layer of SiN of which the thickness is sufficient for forming on the edges of the gate of the spacers, first partially etching portions of the SiN layer outside of the edges so as to reduce the thickness thereof for obtaining residual portions of thickness about equal to e1, then of modifying these residual portions of thickness e1, to finally remove them selectively.

This alternative solution has not been retained in the scope of the present invention, as it has been identified that the residual portions obtained from the etching do not have a constant and/or homogenous thickness. This inhomogeneity of thickness prevents the complete removal of this layer without altering the underlying layer during the modification by implantation through this layer of inhomogeneous thickness. This leads to the appearance of recesses after selective removal of modified residual portions.

The present invention makes it possible to avoid these disadvantages.

BRIEF DESCRIPTION OF THE FIGURES

The aims, objectives, as well as the features and advantages of the invention will better emerge from the detailed description of embodiments of the latter which are illustrated by the following supporting drawings, wherein:

FIG. 2A schematically illustrates a step of depositing a dielectric layer on a gate pattern according to this known method for forming spacers.

FIG. 2B schematically illustrates a step of modifying the dielectric layer by anisotropic implantation according to this known method for forming spacers.

FIG. 2C schematically illustrates a step of removing the modified dielectric layer according to this known method for forming spacers.

FIG. 4A schematically illustrates a step of depositing a first dielectric layer on a gate pattern according to an embodiment of the present invention.

FIG. 4B schematically illustrates a step of modifying basal portions of the first dielectric layer by anisotropic implantation according to an embodiment of the present invention.

FIG. 4C schematically illustrates a step of depositing a second dielectric layer on the first dielectric layer according to an embodiment of the present invention.

FIG. 4D schematically illustrates a step of anisotropically etching basal portions of the second dielectric layer according to an embodiment of the present invention.

FIG. 4E schematically illustrates a step of removing modified basal portions of the first dielectric layer according to an embodiment of the present invention.

Figure 1A:
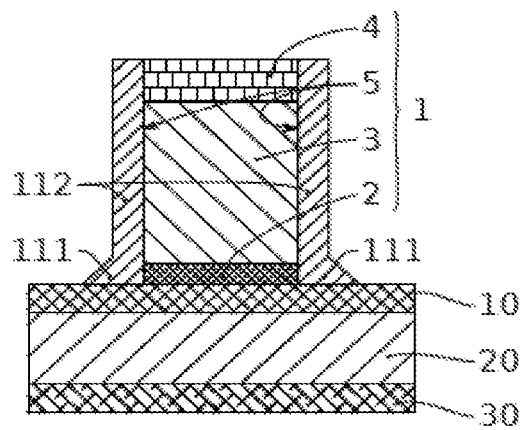
FIG. 1A schematically illustrates, as a cross-section, a gate pattern flanked with spacers on an active layer, the spacers having a food according to the prior art.
Figure 1B:
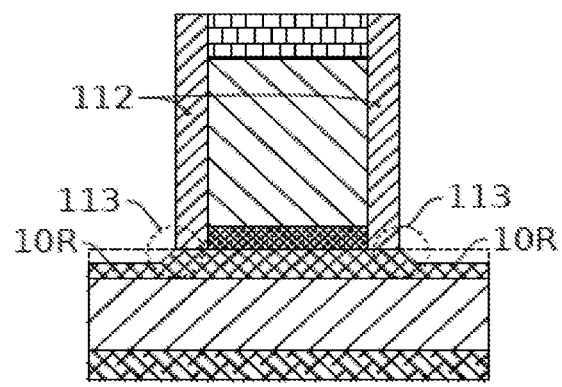
FIG. 1B schematically illustrates, as a cross-section, a gate pattern flanked with spacers on an active layer, the active layer having a recess according to the prior art.
Figure 2A:
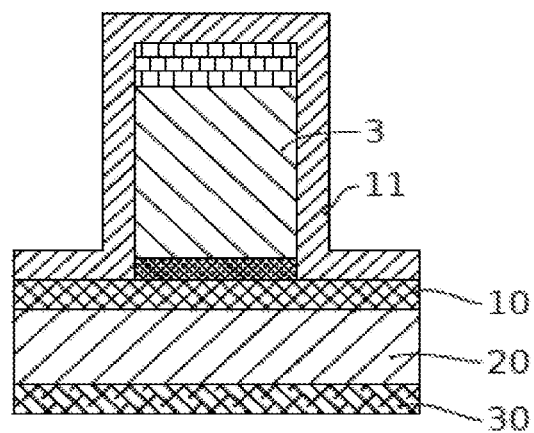
FIGS. 2A to 2C schematically illustrate steps of a method for forming spacers according to the prior art.
Figure 2B:
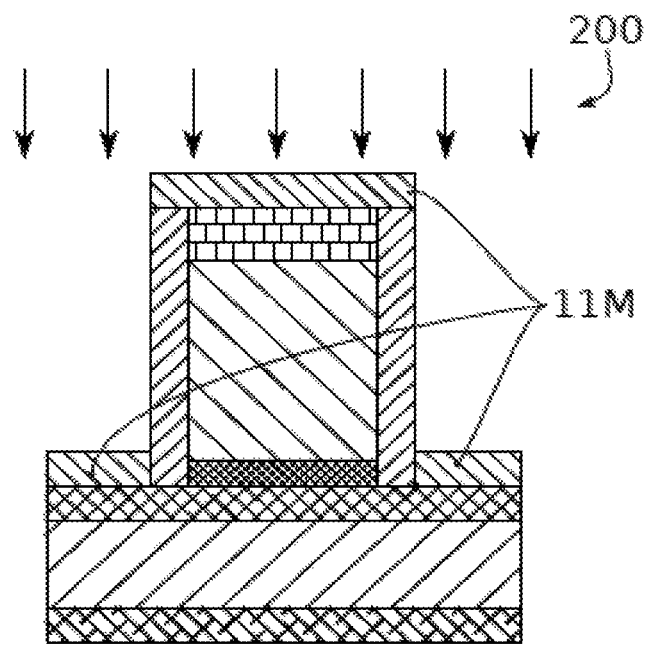
Figure 2C:
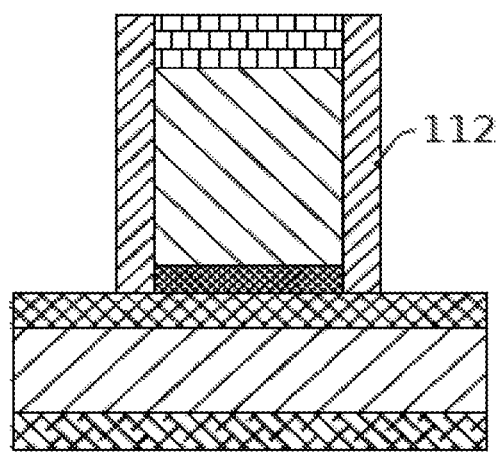
Figure 3:
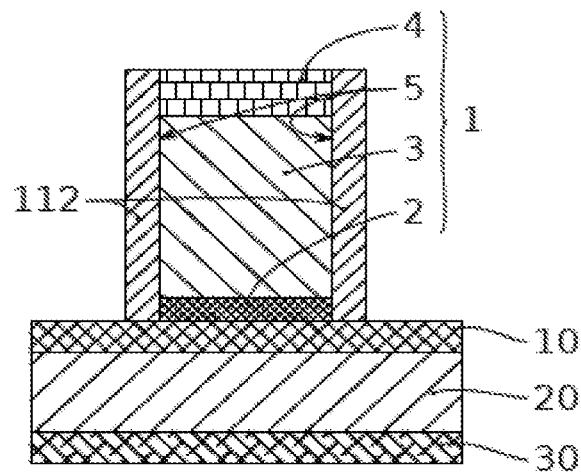
FIG. 3 schematically illustrates an ideal gate pattern flanked with spacers meeting the needs of current transistors.

The drawings are given as examples and are not limiting of the invention. They constitute schematic principle representations intended to facilitate the understanding of the invention and are not necessarily to the scale of practical applications. In particular, the dimensions of the different layers and structures (spacers, gate pattern) are not representative of reality. For the illustrations to be clear, the thickness of the first layer is represented in a significantly exaggerated manner, relative to the thickness of the second layer.

DETAILED DESCRIPTION OF THE INVENTION

Before starting a detailed review of embodiments of the invention, it is reminded that, optionally, the invention comprises at least any one of the following optional features which can be used in association or alternatively.

According to an example, the thickness e1 is less than 4 nm. This thin thickness enables the use of low-energy implantation conditions and which make it possible to specifically control the implantation depth. Thus, it is avoided to implant the underlying layer while ensuring that the whole thickness e1 is modified by implantation. According to an example, the thickness e1 is less than or equal to 2 nm ($10^{-9}$ metres).

According to an example, the spacers have a thickness $E = e1 + e2$ with $E \leq 30$ nm, preferably $E \leq 15$ nm.

According to an example, the first modified basal portions have a thickness e1.

According to an example, the anisotropic modification is carried out by conserving the first non-modified side portions on the side edges of the gate pattern.

According to an example, during the step of removing first modified basal portions, all the first accessible modified basal portions are removed, in particular all the first modified basal portions accessible to a wet etching solution. The portions of the first modified basal portions which are overmounted by the second side portions are not accessible. Indeed, the second side portions mask and protect these portions of the first modified basal portions.

According to an example, the step consisting of removing the first modified basal portions by conserving the first and second non-modified side portions to form spacers is carried out by a selective etching of the first modified dielectric material vis-à-vis the first non-modified dielectric material, of the second dielectric material and of the material of the active layer.

According to an example, the sequence of steps of depositing and anisotropically etching the second layer is repeated at least twice. This repeating of the sequence makes it possible to control with a very good precision of thickness deposited on the edges of the gate pattern, while conserving the first layer which acts as protection for the underlying active layer.

According to an example, said sequence is repeated a number of times making it possible to obtain spacers having a thickness E=e1+e2 with E 30 nm, preferably E 15 nm. Relatively thick spacers can thus be obtained on the edges of the gate pattern.

According to an example, the thickness e2 deposited in terms of each of said sequences is comprised of between 2 and 5 nanometres.

According to an example, the deposition of the first and/or of the second layer is a conformal deposition, such that the first side and basal portions have substantially the same thickness e1, and/or that the second side and basal portions have substantially the same thickness e2.

According to an example, the deposition of the first and second layers is done by a plasma enhanced deposition method. It can be a plasma enhanced atomic layer deposition (PEALD). Alternatively, it can be a plasma enhanced chemical vapour deposition (PECVD). These methods make it possible to deposit, with precision, conformal layers of very low thickness.

According to an example, the anisotropic modification is done by implantation of ions coming from a plasma along a favoured direction parallel to the side edges. According to an example, the ions are hydrogen- or helium-based. This type of implantation makes it possible to modify the implanted layer without destroying it.

According to an example, the implantation is carried out by using a polarisation voltage less than 30V and a pressure less than 80 milli Torr.

According to an example, the anisotropic etching of the second layer is done by ions coming from a plasma along a favoured direction parallel to the side edges, from at least one species which is heavier than helium and preferably from argon (Ar).

According to an example, the at least one species is not of the $C_xH_y$ type, where x is the proportion of carbon (C) and y is the proportion of hydrogen (H). Thus, according to this example, the first layer is not covered by a carbon film. More specifically, the first side portions 11L are not in contact with a carbon film.

According to an example, the etching along the direction normal to the basal plane is done for a polarisation voltage less than 30V and for a pressure less than 80 milli Torr, preferably less than 10 milli Torr.

According to an example, the dielectric material(s) is/are selected from among SiN, SiCO, SiC, SiCN, SiOCN, SiCBN, SiOCH, and $SiO_2$.

According to an example, the dielectric material(s) has/have a dielectric constant less than or equal to 7.

According to an example, the first dielectric material and the second dielectric material are identical. This makes it possible to obtain homogenous spacers on the edges of the gate pattern.

According to an example, the deposition of the first and second layers and the anisotropic modification are carried out within one same reactor. This makes it possible to avoid unintentional oxidations, to reduce the number of steps and the complexity of the method. The manufacturing cost of it is also found to be lessened.

According to an example, the selective etching of the first modified dielectric material is a wet etching using a hydrofluoric (HF) acid-based solution.

According to an example, the hydrofluoric (HF) acid-based solution has an HF dilution comprised between 0.1% and 5% by mass.

Except for any explicit mention, it is specified that, in the scope of the present invention, the relative arrangement of a third layer inserted between a first layer and a second layer, does not compulsorily mean that the layers are directly in contact with one another, but means that the third layer is either directly in contact with the first and second layers, or separated from these by at least one other layer or at least one other element.

It is specified that, in the scope of the present invention, the terms "on", "surmounts", "covers", "underlying", "vis-à-vis" and the possible equivalents thereof do not necessarily mean "in contact with". Thus, for example, the deposition, the extension, the gluing, the assembly or the application of a first layer on a second layer, does not compulsorily mean that the two layers are directly in contact with one another, but means that the first layer covers at least partially the second layer by being either in direct contact with it, or by being separated from it by at least one other layer or at least one other element.

A layer can moreover be composed of several sublayers of one same material or of different materials.

The steps of forming different layers extending in the broadest sense: they can be carried out in several sub-steps (in particular, cycles of adsorbing drain precursors in the case of a deposition of atomic thin layers).

By a substrate, this means a layer, a device, "base on" a material M, a substrate, a layer, a device comprising this material M only or this material M and possibly other materials, for example alloy elements, impurities or doping elements. Thus, a silicon nitride SiN-based dielectric layer can, for example, comprise non-stoichiometric silicon nitride (SiN), or stoichiometric silicon nitride ($Si_3N_4$), or also a silicon oxynitride (SiON).

The word "dielectric" qualifies a material of which the electric conductivity is sufficiently low in the given application to be used as an insulator. In the present invention, a dielectric material preferably has a dielectric constant less than 7.

The dielectric materials considered in the scope of the present invention are, in a non-limiting manner, SiN, SiCO, SiC, SiCN, SiOCN, SiBCN, SiOCH, $SiO_2$.

The modified dielectric material is considered different from the non-modified dielectric material.

The terms "dielectric material", "initial dielectric material", "non-modified dielectric material" are synonymous.

The terms "gate pattern", "gate stack", "gate" are used as synonyms.

In the present patent application, thickness will preferably be referred to for a layer and height, for a device (gate transistor, for example). The height is taken along a direction normal to the basal plane. The thickness in a point of the layer is taken along a direction normal to the tangent to the layer in this point. Thus, in the figures, the thickness is taken along the vertical in the zones which extend mainly horizontally, such as the basal portions. However, the thickness is taken along the horizontal in the zones which extend mainly vertically, such as the side portions. Thus, the thickness of the spacers which cover the vertical edges of a gate or of a gate pattern will be measured along the horizontal direction in the figures.

The terms "substantially", "about", "of the order of" mean "nearly 10%" or, when it is an angular orientation, "nearly 10°". Thus, a direction substantially normal to a plane means a direction having an angle of 90±10° with respect to the plane.

To determine the geometry of the spacers and the arrangement of the different layers, electron microscope analyses can be proceeded with, in particular Scanning Electron Microscopy (SEM) or Transmission Electron Microscopy (TEM).

The chemical compositions of the different layers or regions can be determined using the well-known EDX or X-EDS method (Energy Dispersive X-ray Spectroscopy).

This method is well adapted for analysing the composition of thin layers such as the active layer and the spacers. It can be implemented on metallurgic cross-sections within an SEM or a TEM.

These techniques in particular make it possible to determine if the spacers have a foot, if there are dielectric layer residues on the active layer, if there are structural defects or recesses in the active layer.

By implementing the method according to the invention, spacers are formed without any feet or with a foot of reduced size, the dielectric layer residues are reduced, even removed, and the active layer is preserved from the structural defects or from the recess.

An embodiment of the method for forming spacers according to the invention will now be described in reference to FIGS. 4A to 4E and to FIG. 6.

According to this embodiment, a gate stack or gate pattern 1 resting on a substrate 100 is provided.

The substrate 100 can be a developed substrate of semi-conductor on insulator type, for example a silicon on insulator (SOI) substrate or a germanium on insulator (GeOI) substrate, or also a silicon-germanium (SiGe) on insulator substrate.

This substrate 100 can typically comprise a solid silicon support 30, a buried oxide layer 20 also called BOX ("Buried Oxide") and a silicon- or germanium-based semi-conductive active layer 10.

The active layer 10 is preferably made of silicon (Si) or of silicon-germanium (SiGe).

The active layer 10 is surmounted by a gate stack or gate pattern 1. Conventionally, the gate stack can comprise a succession of layers arranged from the active layer 10, such as, for example:
 a high dielectric constant layer 2, called "high k" layer,
 a metal gate 3, for example made of polycrystalline silicon, and
 a layer 4 forming a hard mask at the top of the gate 3.

The gate stack typically has a height of several tens of nanometres to several hundreds of nanometres.

Below in the description, this stack will be designated gate pattern 1 or HKMG ("High K Metal Grid").

Figure 6:
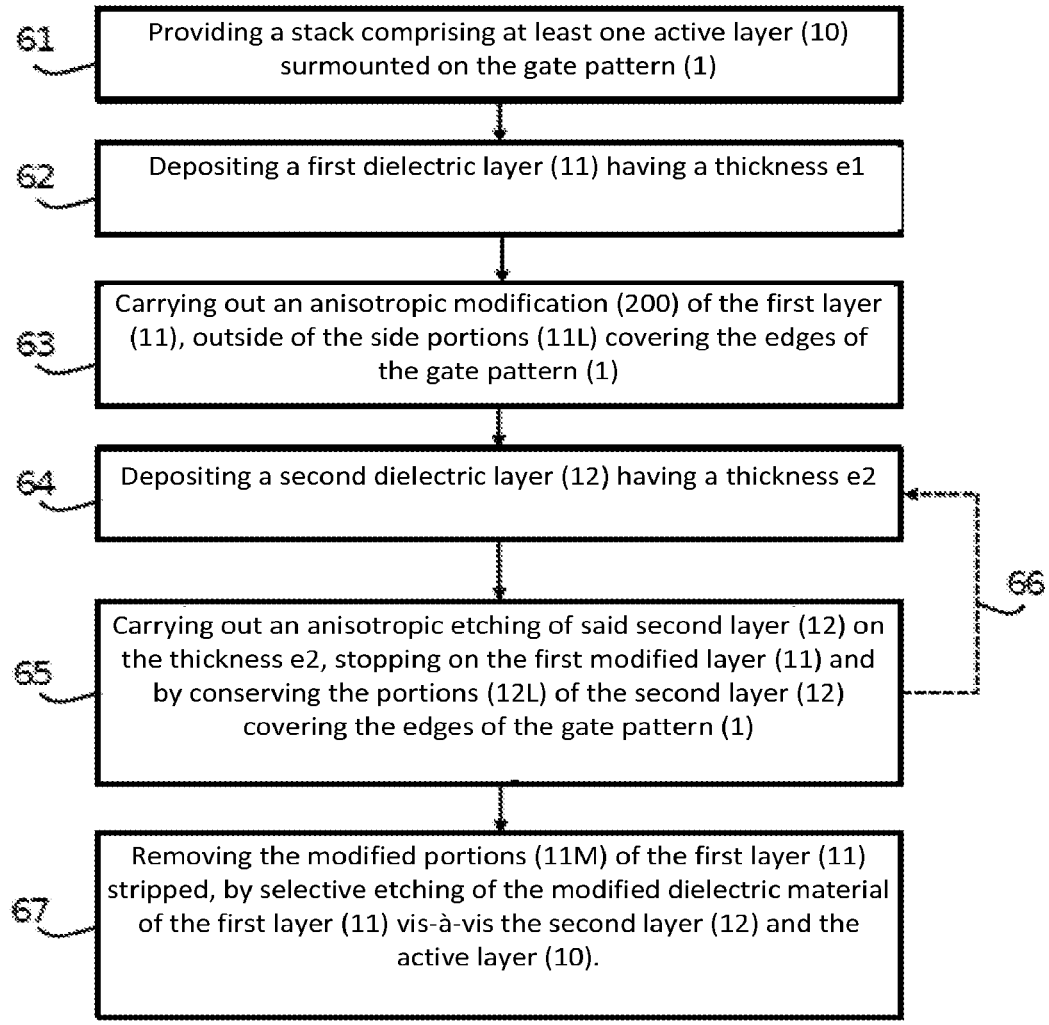
FIG. 6 summaries certain steps of the embodiment illustrated in FIGS. 4A to 4E.

The step referenced 61 in FIG. 6 corresponds to the provision of such a stack.

Figure 4A:
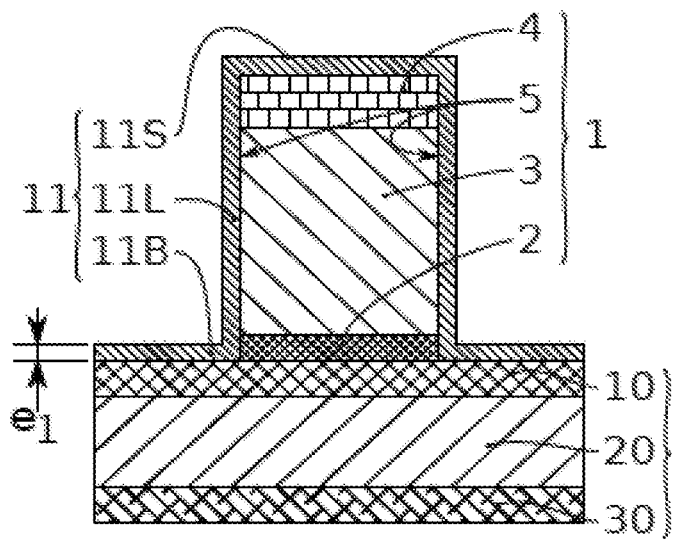
FIGS. 4A to 4E schematically illustrate steps of a method for forming spacers according to an embodiment of the present invention.

Such as illustrated in FIG. 4A, a first layer 11 made of a dielectric material is deposited on the gate pattern 1 and on the semi-conductive active layer 10, preferably in a conformal manner. This deposition corresponds to the step referenced 62 in FIG. 6.

The deposition of the dielectric material is preferably carried out by a first plasma enhanced deposition. It can be a deposition of plasma enhanced atomic layer deposition (PEALD). Alternatively, it can be a plasma enhanced chemical vapour deposition (PECVD). These types of depositions make it possible to obtain a layer of which the thickness is thin, perfectly controlled and having a conformal profile. Thus, the thickness of the first layer 11 is homogenous over the whole surface of the substrate and of the gate pattern 1. These types of depositions also make it possible to obtain a dense, stoichiometric material (for example, $Si_3N_4$), uniformly encapsulating the gate pattern 1.

Furthermore, these types of plasma enhanced depositions make it possible to limit the deposition temperature so as to preserve the gate pattern 1, in particular the HKMG stack.

This first layer 11 comprises first side portions 11L on each of the side edges of the gate pattern 1, first basal portions 11B on the surface and in contact with the active layer 10 on either side of the gate pattern 1, and a first high portion 11S at the top of the gate pattern 1. The first side portions 11L extend along planes perpendicular to the basal plane and the first basal portions 11B extend along planes parallel to the basal plane.

Preferably, the first layer 11 is deposited directly in contact with the active layer 10. Preferably, also, the first layer 11 is deposited directly in contact with the edges of the gate pattern 1.

The first layer 11 has a thickness e1 comprised between 1 nm and 4 nm, preferably between 1 nm and 3 nm and also more preferably, between 1 nm and 2 nm.

Figure 4B:
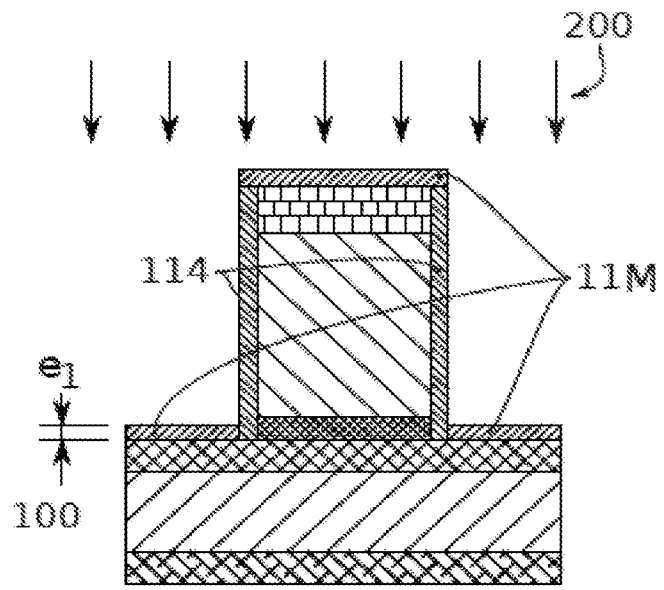

As illustrated in FIG. 4B, a first step of anisotropically modifying the first layer 11 is carried out. This modification corresponds to step 63 of FIG. 6. This anisotropic modification 200 is configured to modify the initial dielectric material.

It can, in particular, be carried out by implantation of species, in particular ions, at the level of the portions of the layer 11 extending mainly along the basal plane. This anisotropic implantation is carried out along a main direction of bombardment of ions. This main direction is therefore parallel to the side edges of the gate pattern 1.

The anisotropic modification 200 is configured to modify the dielectric material of the first basal portions 11B over the whole of the thickness e1 thereof, and of the first high portion 11S possibly over the whole of the thickness e1 thereof.

The first basal and high portions 11B, 11S thus become first modified portions 11M.

The first side portions 11L are advantageously non-modified from this anisotropic modification step. Indeed, these first side portions 11L extend in planes parallel to the favoured implantation direction.

The parameters of the implantation, in particular the nature of the implanted species, as well as the concentration thereof, are configured such that the modified portions 11M will have an etching speed greater than the non-modified portions 11L during a subsequent etching step, as will be explained in detail below.

As will be described below in the section "anisotropic modification", a modification by implantation of light ions from a plasma will be favoured.

This implantation is carried out so as to modify the structure of the first layer 11 in the implanted zones, without leading to this layer being destroyed. Advantageously, the implantation is carried out such that the implanted ions are distributed uninterruptedly from the surface of the first layer 11 to the interface between this first layer 11 and the layer which itself is underlying typically the active layer 10. This distribution has no discontinuity. There are therefore no layers where the implanted species are absent within the first layer 11.

A plasma implantation has the advantage of making it possible for a continuous implantation in a volume extending from the surface of the implanted layer. This continuity of implantation makes it possible to improve the homogeneity of the modification, which then leads to an etching of the implanted layer at a constant etching speed along the whole thickness of the implanted layer. Moreover, the increase of the selectivity conferred by the implantation vis à vis other layers is effective from the start of the etching of the implanted layer. The plasma implantation thus makes it possible for a significantly improved controlling of the etching precision.

Moreover, particularly advantageously, since the thickness e1 is low, it is thus possible to implant all of this thickness with ions having a low energy. Subsequently, it is possible to control both, that the first layer is effectively implanted on the whole of the thickness e1 thereof and that the implanted ions do not reach the underlying active layer 10. Thus, contrary to current solutions which provide the implantation of a thicker layer, the active layer 10 is not altered by this step of modifying by implantation.

Figure 4C:
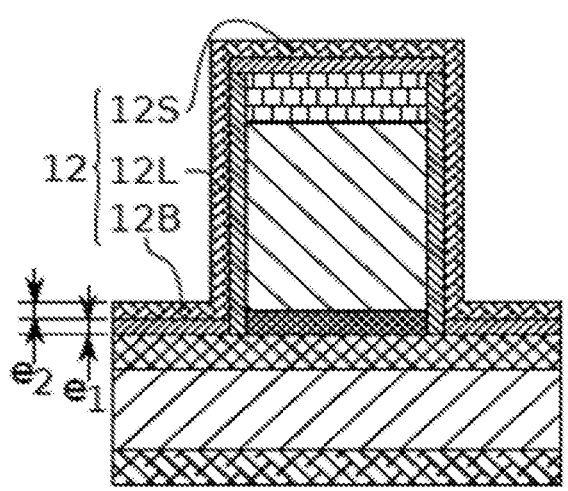

As illustrated in FIG. 4C, a second layer 12 made of a dielectric material is deposited on the first layer 11 and preferably in contact with the first layer 11. This deposition corresponds to the step referenced 64 in FIG. 6. Preferably, this deposition is carried out in a conformal manner. The dielectric material of the second layer 12 is preferably the same as that of the first layer 11. According to an alternative embodiment, the dielectric material of the first layer 11, designated first dielectric material is different from the dielectric material of the second layer 12, designated second dielectric material.

This second deposition is preferably plasma enhanced. It is preferably a PEALD or PECVD deposition.

The first and second conformal depositions are illustrated and described in more detail below, in the section "conformal depositions of the first and second layers".

The second layer 12 has a thickness e2. Advantageously, e2 is greater than or equal to e1. Preferably, e1<0.5×e2. Preferably, e2 is comprised between 5 nm and 30 nm, preferably between 8 nm and 15 nm. This makes it possible to thicken the spacer formed on the edges 5 of the gate pattern 1 quickly. According to an alternative embodiment, it can be that e2 is less than or equal to e1.

This second layer 12 comprises second side portions 12L on each of the side edges of the gate pattern 1, in contact with the first side portions 11L. Thus, according to this example, there is no other layer, for example a carbon layer, situated between the second side portions 12L and the first side portions 11L.

The second layer 12 also comprises second basal portions 12B on the surface and in contact with first modified basal portions 11B, on either side of the gate pattern 1.

The second layer 12 also comprises a second high portion 12S at the top of the gate pattern 1, on the first modified high portion 11S.

The second side portions 12L extend along planes perpendicular to the basal plane and the second basal portions 12B extend along planes parallel to the basal plane.

Figure 4D:
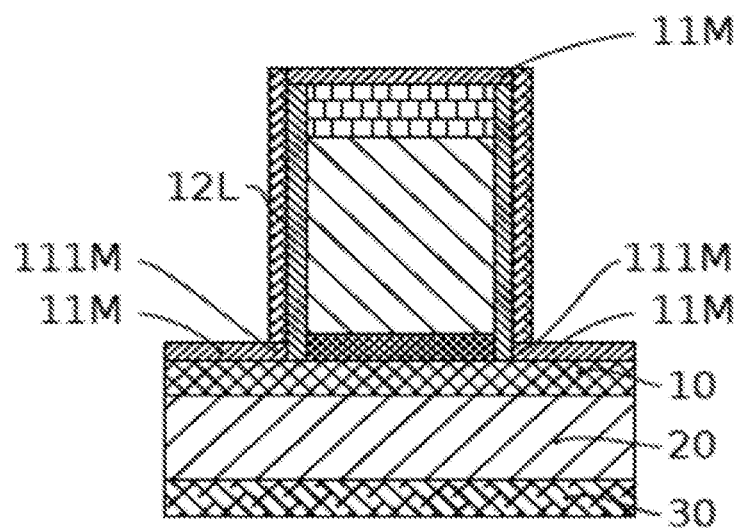

As illustrated in FIG. 4D, a step of anisotropically etching the second layer 12 is carried out. This etching step is referenced 64 in FIG. 6. The favoured direction of this anisotropic etching is substantially parallel to the planes wherein extend the edges of the gate pattern 1. Thus, this anisotropic etching is configured to remove the second basal portions 12B and the second high portion 12S. However, the second side portions 12L situated on the edges of the gate pattern 1 are advantageously preserved from this anisotropic etching step or are consumed on a lesser thickness.

Different etching solutions adapted to this anisotropic etching step are detailed below, in the section "anisotropic etching".

The anisotropic etching is carried out so as to expose the first modified portions 11M. Preferably, the anisotropic etching is stopped so as to consume the whole thickness e2 of the second layer 12 of the portions 12B by stopping at the interface between these portions 12B and the portions 11M. Thus, the thickness e1 is not consumed. The stopping of this etching is controlled over time. However, it can be provided that this anisotropic etching consumes a portion of the thickness e1, as the portions 11M continue to form a protective layer which protects the active layer 10 during this anisotropic etching step.

Thus, from the anisotropic etching of the portions 12S and 12B of the second layer 12:

all or some of the thickness of the portions 12L of the second layer 12 situated on the edges of the gate pattern 1 are conserved. Thus, a spacer 112 is formed on these edges.

the whole thickness is ensured to be conserved, or at least some of the thickness of the first modified portions 11M. These modified portions 11M thus cover the active layer 10 and act on the latter as a protective or masking layer during the anisotropic etching of the second layer 12. Thanks to the presence of the modified portions 11M of the first layer 11, the active layer 10 is not damaged during the anisotropic etching of the portions 12S and 12B.

In the example illustrated in FIGS. 4A to 4E, one single sequence is carried out comprising the step of depositing the second layer 12 and the anisotropic etching of the portions 12S and 12B. According to another embodiment, successively a plurality of sequences is carried out, each comprising these two steps. Thus, at each sequence, the thickness of the portions 12L is increased, covering the edges of the gate pattern 1. This makes it possible to obtain, on the edges of the gate pattern 1, spacers 112 having a significant thickness without having to etch a significant thickness for the portions 12S and 12B. During this etching, it is thus possible to use less aggressive and therefore more precise etching conditions. The arrow 66 in FIG. 6 illustrates this optional embodiment consisting of carrying out several sequences of steps of depositing and anisotropically etching the second layer 12.

Particularly advantageously, the first and second depositions, the anisotropic modification and the anisotropic etching are carried out within one same reactor. This makes it possible to avoid any interfering oxidation of the different layers and portions between each step. Controlling the CD and the morphology of the layers is optimised. This also makes it possible to simplify the method and to reduce the costs.

Figure 4E:
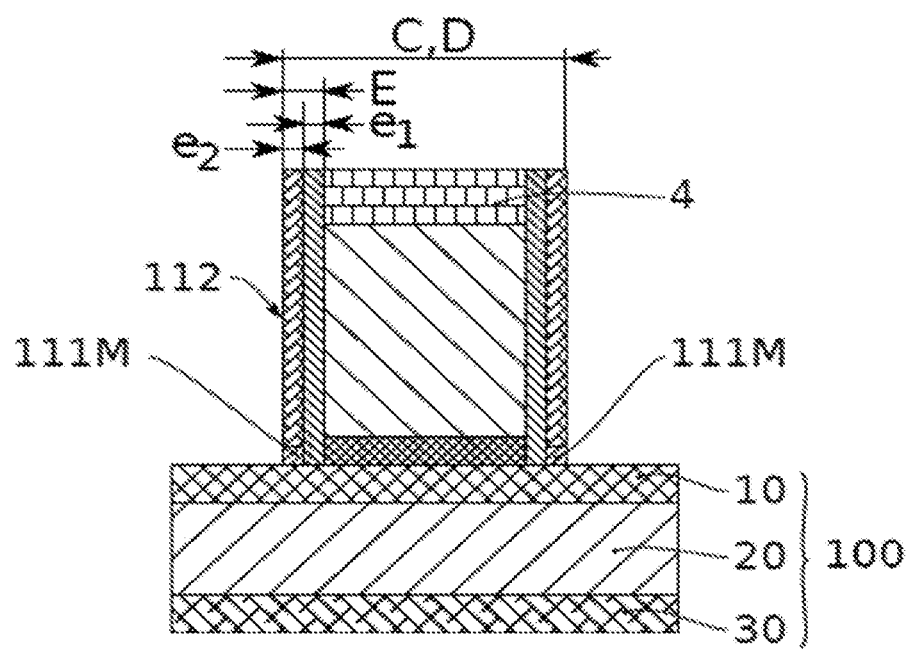

From the anisotropic etching, a step of removing the first modified portions 11M is carried out, such as illustrated in FIG. 4E. This step is referenced 67 in FIG. 6.

This removal step is configured to remove the accessible modified dielectric material, i.e. stripped, selectively at the non-modified dielectric material situated on the edges 5 of the gate pattern 1 and at the semi-conductive material of the active layer 10. For this, an etching chemistry is used, making it possible to etch the modified dielectric material selectively at the non-modified dielectric material and at the semi-conductive material of the active layer 10. It will be noted that the portions 111M of modified dielectric material situated just under the side portions 12L are not accessible, for example by a wet etching solution. These portions 111M are indeed masked and therefore protected by the side portions 12L outside of this removal step. Moreover, this removal step is controlled so as to be interrupted before these portions 111M are etched laterally, i.e. along a direction parallel to the upper face of the substrate 100.

The second side portions 12L and the active layer 10 are thus preserved.

Different embodiments of the removal step are described in detail below, in the section "selective removal".

From this removal step, the spacers 112 are formed. These spacers 112 comprise the portions 111M of modified dielectric material which remain in place from the removal step.

These spacers 112 comprise the first and second side portions 11L, 12L. They thus have a uniform and perfectly controlled thickness E=e1+e2.

Different embodiments of the steps mentioned above will now be described in detail.

Figure 5:
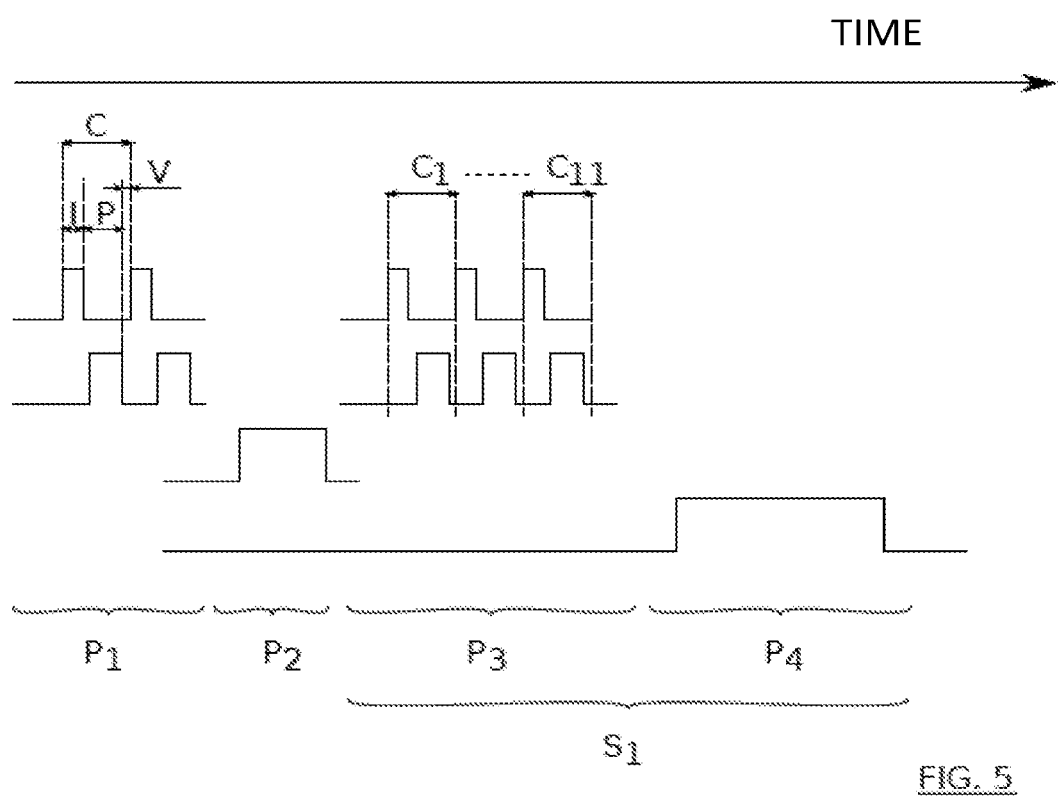
FIG. 5 schematically illustrates the succession over time of different phases of depositing, implanting and etching the method for forming spacers according to an embodiment of the present invention.

FIG. 5 illustrates, on one same timescale, the succession of different phases P1, P2, P3, P4 of conformal depositions (P1 and P3), of anisotropic modification (P2), and of anisotropic etching (P4) within one same reactor. These different phases will be detailed below.

Conformal Depositions of the First and Second Layers

FIG. 5 illustrates a phase P1 corresponding to the conformal deposition of the first layer 11, and a subsequent phase P3 corresponding to the conformal deposition of the second layer 12.

The depositions of the first 11 and second 12 layers typically comprise a plurality of successive cycles intended to form a plurality of superposed atomic layers. The first 11 and second 12 layers are thus formed by superposition of atomic layers of dielectric material. This makes it possible to precisely control the thicknesses of these layers 11, 12.

Such as illustrated in FIG. 5, each cycle C typically comprises an injection I of a gaseous precursor within the reactor. This precursor is thus disconnected using a plasma P. Reactive species are thus formed then adsorbed on the deposition surfaces.

This adsorption makes it possible to form an atomic layer of the dielectric material on the deposition surfaces.

The excess precursor and/or reactive species is then evacuated by a drain V of the reactor at the end of cycle C.

The gaseous precursors and the plasma used depend on the dielectric material to be deposited.

The number of cycles carried out determines the number of atomic layers deposited and, actually, the total thickness of the dielectric layer formed.

To form a silicon nitride SiN layer, a silicon-based precursor combined with a nitrogen-based plasma can be used. To form this nitrogen-based plasma, $N_2$ or $NH_3$, for example, can be injected in the reactor.

A dichlorosilane (DCS) precursor combined with an ammoniac plasma can also be used. The deposition temperature is typically comprised between 500° C. and 650° C. This range of deposition temperatures makes it possible to improve the quality of the SiN layer obtained.

A precursor of type Di(Sec-ButylAmino)Silane (DSBAS, $SiH_3N({}_sBu)_2$) can be preferably used, combined with an ammoniac or nitrogen plasma. This type of precursor has the advantage of having one single amino group and makes it possible to obtain very good quality films, in particular when it is combined with an $N_2$ plasma and when the deposition temperature is of the order of 400° C. In particular, this type of deposition has a very good density, a very low contamination and a low wet etching speed (usually designated by "WER"—wet-etch rates).

To form a SiBCN layer, boron trichloride BCl3 and methane can, for example be added to the DCS.

Preferably, the substrate and/or the deposition surfaces are not polarised so as to obtain a conformal deposition. In other words, the polarisation voltage is zero or very low.

Preferably, a deposition cycle C corresponds to the formation of a layer having a thickness of the order of 0.1 Å to 0.2 Å. Preferably, a deposition cycle C corresponds to the formation of one single atomic layer.

For example, 80 successive cycles C1-Cn (n=80) make it possible to form a dielectric layer of about 12 nm (FIG. 5).

The number of cycles is thus adapted to the desired layer thickness.

According to an advantageous possibility, the thickness of the depositions is controlled in situ by ellipsometry, cycle after cycle.

Anisotropic Modification 200

The anisotropic modification of the first layer 11 is advantageously carried out within the same reactor, after the deposition of the first layer 11 of 1 nm to 2 nm thick. As mentioned above, this step makes it possible to modify the first basal and high portions 11B, 11S over the whole thickness e1 of the first layer 11.

However, this modification does not modify the first side portions 11L situated on the edges of the gate pattern 1.

This anisotropic modification 200 is carried out by implantation of light ions from a plasma. As indicated above, an implantation from a plasma has numerous advantages, since it makes it possible to very precisely implant the whole thickness of the first layer 11 which is thin, without modifying the layer which itself is underlying, typically, the active layer 10.

If it is sought to use the same etching reactor for the step of depositing the first layer 11 and for the anisotropic modification step 200, it is preferable to use a plasma reactor making it possible to carry out a conformal deposition, typically a PEALD or PECVD reactor.

The plasma can be hydrogen (H)-based. According to an embodiment example, this modification comprises the implantation of hydrogen-based ions (H, H+, H2+, H3+, etc.). According to another embodiment, the implanted ions are helium (He) ions or a mixture of helium and hydrogen (H/He) ions.

These ions can, for example, come from the following gases, introduced in the reactor: $H_2$, HBr; $NH_3$.

To obtain a good selectivity during the step of removing modified portions 11M, the implantation is adjusted such that the concentration of light ions in the first implanted layer 11 is ideally comprised between $10.10^{\wedge}12$-$10.1012$ ions/cm$^3$.

In order to obtain a precise implantation over the whole thickness e1, and in particular to stop this implantation at the interface between the first dielectric layer 11 and the active layer 10, among the parameters retained for the plasma, it is provided that the polarisation voltage (bias) are sufficiently low to avoid a damaging of the underlying active layer 10. Preferably, this polarisation voltage is less than 30V. Indeed, the method described below provides a low thickness e1 for the first layer 11. It is thus possible to use a reduced polarisation voltage which makes it possible to perfectly control the depth at which the ions are implanted. Contrary to known methods aiming to modify layers of thicker thicknesses, typically greater than 8 nm, the claimed method makes it possible to avoid implanted ions reaching up into the active layer 10. This active layer 10 is thus not altered. Preferably, the polarisation voltage is greater than 10V, so as to accelerate and to direct the ions along a direction normal to the substrate.

Moreover, in order to improve the precision of the implantation over the whole thickness e1 by avoiding the active layer 10 being altered, at least one of the following plasma parameters can be used:

The pressure within the reactor is less than 100 milli Torr, and preferably less than 30 milli Torr. The pressure is preferably of the order of 10 milli Torr. This makes it possible to have ions mainly directly along a direction normal to the substrate 100. The side portions 11L are thus preserved from this implantation.

The temperature applied to the substrate is preferably less than 100° C. This makes it possible to avoid a desorption of the implanted hydrogen ions. The modification of the portions 11B, 11S of the first dielectric layer 11 is thus more effective.

These implantation conditions are, for example, determined by simulation by using SRIM (stopping and range of ions in matter) or TRIM (transport simulation of ions in matter) type simulation tools.

A phase P2 of implanting light ions is illustrated in FIG. 5, after the phase P1 of depositing the first layer 11.

Anisotropic Etching

As mentioned above, the anisotropic etching makes it possible to etch the second basal and high portions 12B, 12S over the whole thickness e2.

However, the second side portions 12L are preserved during this etching.

The anisotropic etching is preferably carried out within the same reactor, after the deposition of the second layer 12 of 8 nm to 15 nm thick.

This anisotropic etching is carried out by bombardment of ions from a plasma.

As for the step of modifying by implantation, the plasma used for the anisotropic etching step can be with capacitive coupling (CCP) or with inductive coupling (ICP).

The plasma can be based on species heavier than hydrogen and preferably heavier than helium. The parameters used for this etching can lead to the bombardment of these species on the second layer 12 leading to the removal thereof by destroying. To this end, ions heavier than argon (Ar) can be used.

In order to obtain an anisotropic etching, at least one of the following plasma parameters are preferably used:

The pressure within the reactor is less than 80 milli Torr, and preferably of the order of 10 milli Torr. This makes it possible to have ions mainly directed along a direction normal to the substrate. The side portions 12L are thus preserved during this etching.

The polarisation voltage is preferably greater than 10V, so as to accelerate and direct the ions along a direction normal to the substrate. It is less than 100V, and preferably less than 30V, so as to avoid a damaging of the underlying layers, in particular of the active layer 10.

These implantation conditions are, for example, determined by simulation by using SRIM (stopping and range of ions in matter) or TRIM (transport simulation of ions in matter) type simulation tools.

An anisotropic etching phase P4 is illustrated in FIG. 5, after the phase P3 of depositing the second layer 12.

The phase P3 and the phase P4 constitute a sequence, referenced S1 in FIG. 5. This sequence makes it possible to leave in place a thickness e2 of dielectric layer on the edges of the gate pattern 1.

This sequence S1 can be carried out only once or a plurality of times. For example, the steps of second conformal deposition and of anisotropic etching can be repeated X times so as to obtain second side portions 12L having the thickness X.e2. The spacers 112 can subsequently have a thickness E=e1+X.e2, according to needs.

Selective Removal

Several embodiment variants for the selective removal of the first modified portions 11M of the first dielectric layer 11 are possible.

Dry or wet etching chemistries can be used.

According to an embodiment, the step of removing the first modified portions 11M is carried out by selective wet etching vis-à-vis the semi-conductive material of the active layer 10 and of the non-modified dielectric material of the spacers 112. Such a selective wet etching can be done using a hydrofluoric (HF) acid-based solution. In this case, a hydrofluoric (HF) acid-based solution can be used having an HF dilution comprised between 0.1% and 5% by mass.

Preferably, the selective etching is obtained using a hydrofluoric (HF) acid-based solution. Such a solution is selective vis-à-vis silicon (Si), silicon-germanium (SiGe), and silicon nitride (SiN).

As an example for a first SiN dielectric layer 11, with a hydrofluoric (HF) acid-based solution, the etching speed ratio between modified SiN and SiN is of the order of 30.

This makes it possible to fully remove the first modified portions 11M without consuming the first and second non-modified side portions 11L, 12L on the edges 24 of the gate pattern 1, and without consuming the active layer 10.

When the dielectric material is taken from among: silicon nitride, SiC, SiCN, SiCBN, the selective removal of the first modified portions 11M vis-à-vis the first and second non-modified side portions 11L, 12L preferably comprises a wet etching based on a solution comprising hydrofluoric (HF) acid diluted to x % by mass, with $0.1 \leq x \leq 5$.

According to an advantageous possibility, this solution furthermore has a pH less than or equal to 1.5, and preferably strictly less than 1.

Surprisingly, such an etching solution makes it possible to increase very significantly the selectivity $S_{11M:SIO2}$ of the etching of the modified dielectric layer vis-à-vis silicon oxide ($SiO_2$)-based materials.

For example, a selectivity $S_{11M:SIO2} \approx 33:1$ can be obtained.

This improved selectivity in particular makes it possible to preserve the hard mask 4 made of $SiO_2$ at the top of the gate pattern 1.

According to another embodiment, the selective removal step is carried out by dry etching.

Such a dry etching can be done by nitrogen trifluoride ($NF_3$)-based plasma and/or ammoniac ($NH_3$)-based plasma.

The dry etching can comprise a step of transforming the first modified portions 11M made of solid salts, followed by a step of sublimating these solid salts. This embodiment makes it possible to obtain a very good selectivity of the etching of the modified nitride with respect to the non-modified nitride and to the semi-conductive material. This selectivity can be greater than that obtained with an HF solution.

Advantageously, the dry etching consumes the first modified portions 11M of the first dielectric layer 11, preferably at the first and second non-modified side portions 11L, 12L and at the active layer 10. The risk of excessive consumption of semi-conductive material on the surface of the active layer 10 is thus reduced, even removed.

Regarding the description above, it clearly appears that the claimed method proposes a solution which is simple to implement and particularly effective for improving the dimensional controlling of the spacers, while reducing the risks of feet or recesses appearing at the base of the gate pattern.

The invention is not limited to the embodiments described and above, and extends to all the embodiments covered by the claims. In the embodiments illustrated, the gate pattern 1 is produced prior to the steps of the invention. These figures thus illustrate a "gate first" type method.

According to another embodiment covered by the claims, the functional gate stack is produced subsequently to the steps of the invention. A sacrificial pattern is subsequently used instead of the gate stack. This sacrificial pattern is then removed once the spacers are produced. This alternative embodiment is a "gate last" type method.

The invention claimed is:

1. A method for forming spacers on a transistor gate pattern comprising the following successive steps:
   providing a stack comprising at least one active layer extending along a basal plane and a gate pattern surmounting the active layer, the gate pattern having side edges extending along planes perpendicular to the active layer,
   depositing on the gate pattern and the active layer, a first layer made of a first dielectric material having a thickness e1, the first layer comprising first side portions covering the side edges of the gate pattern, and further comprising first basal portions extending parallel to said basal plane and covering the active layer,
   carrying out an anisotropic modification of said first layer along a direction parallel to the side edges, so as to obtain first modified basal portions by conserving first non-modified side portions,
   carrying at least one sequence comprising the following steps:
      depositing on said first layer, a second layer made of a second dielectric material having a thickness e2 and comprising second side portions covering the first non-modified side portions, said second side portions being directly in contact with the first non-modified side portions, and second basal portions, extending parallel to the basal plane and covering the first modified basal portions, and
      carrying out an anisotropic etching of said second layer along said direction parallel to the side edges, so as to remove the second basal portions and conserving at least one portion of the second side portions, and
   removing the first modified basal portions which are stripped from said anisotropic etching of said second layer by conserving the first non-modified side portions and the at least one portion of the second side portions to form spacers, by selective etching of the first modified dielectric material vis-à-vis the first non-modified dielectric material, of the second dielectric material and of the material of the active layer.

2. The method according to claim 1, wherein the deposition of the first and second layers and the anisotropic modification are produced within one same reactor.

3. The method according to claim 1, wherein e1 is less than e2.

4. The method according to claim 1, wherein the thickness e1 is less than or equal to 2 nm ($10^{-9}$ meters).

5. The method according to claim 4, wherein said sequence is repeated a number of times making it possible to obtain spacers having a thickness E=e1+e2 with E≤30 nm.

6. The method according to claim 4, wherein said sequence is repeated a number of times making it possible to obtain spacers having a thickness E=e1+e2 with E≤15 nm.

7. The method according to claim 1, wherein the deposition of the first and second layers is a conformal deposition, such that the first side and basal portions have substantially the same thickness e1, and that the second side and basal portions have substantially the same thickness e2.

8. The method according to claim 1, wherein the deposition of the first and second layers is done by a plasma enhanced deposition method.

9. The method according to claim 1, wherein the anisotropic modification is done by implanting ions coming from a plasma along the direction parallel to the side edges, the ions being hydrogen- or helium-based.

10. The method according to claim 1, wherein the anisotropic modification of said first layer is carried out so as to obtain first modified basal portions along the whole of the thickness e1 thereof and by conserving the first non-modified side portions.

11. The method according to claim 1, wherein the anisotropic etching of the second layer is done by ions coming from a plasma along the direction parallel to the side edges, from at least one species heavier than helium.

12. The method according to claim 11, wherein the at least one species is not of a $C_xH_y$ type where x is a proportion of carbon (C) and y is a proportion of hydrogen (H).

13. The method according to claim 1, wherein the first dielectric material and the second dielectric material each have a dielectric constant less than or equal to 7.

14. The method according to claim 1, wherein the first dielectric material and the second dielectric material are selected from among SiN SiCO, SiC, SiCN, SiOCN, SiCBN, SiOCH, CBN, BN, SiCBO, and $SiO_2$.

15. The method according to claim 1, wherein the first dielectric material and the second dielectric material are identical.

16. The method according to claim 1, wherein the selective etching of the first modified dielectric material is a wet etching using a hydrofluoric (HF) acid-based solution, the hydrofluoric (HF) acid-based solution having an HF dilution comprised between 0.1% and 5% by mass.

17. A method for producing a FinFET or FDSOI type transistor comprising a stack comprising at least one active layer extending along a basal plane and a gate pattern surmounting the active layer, the gate pattern having side edges extending along planes substantially perpendicular to the active layer, the method comprising a method for forming spacers on the gate pattern according to claim 1.

18. The method according to claim 1, wherein e1<0.5×e2.

19. The method according to claim 1, wherein the anisotropic etching of the second layer is done by ions coming from a plasma along the direction parallel to the side edges, selected from argon (Ar) or a heavier species.

20. The method according to claim 1, wherein removing the first modified basal portions comprises forming the spacer comprising a conserved first non-modified side portion in direct contact with a conserved second side portion and a remaining portion of the first basal portion not removed during removing the first modified basal portions.

* * * * *